United States Patent
Jau

(10) Patent No.: US 12,276,610 B1
(45) Date of Patent: Apr. 15, 2025

(54) SUPER RESOLUTION AND FAST SURFACE B-FIELD IMAGING USING AN NV-DIAMOND

(71) Applicant: National Technology & Engineering Solutions of Sandia, LLC, Albuquerque, NM (US)

(72) Inventor: Yuan-Yu Jau, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 68 days.

(21) Appl. No.: 18/242,916

(22) Filed: Sep. 6, 2023

(51) Int. Cl.
*G01N 21/64* (2006.01)
*G01N 21/17* (2006.01)

(52) U.S. Cl.
CPC ..... *G01N 21/6404* (2013.01); *G01N 21/1717* (2013.01); *G01N 21/6456* (2013.01);
(Continued)

(58) Field of Classification Search
CPC .... G01N 24/10; G01N 21/64; G01N 21/6489; G01N 21/645; G01N 2201/10; G01N 24/006; G01N 24/08; G01N 21/6458; G01N 24/12; G01N 21/6408; G01N 33/551; G01N 2201/06113; G01N 33/54366; G01N 2021/1727; G01N 21/6428; G01N 21/66; G01N 21/1717; G01N 21/6402; G01N 21/648; G01N 21/87; G01N 2201/0221; G01N 33/54346; G01N 21/63; G01N 22/00; G01N 24/088; G01N 33/588; G01N 2021/646; G01N 2021/6495; G01N 2021/7783; G01N 21/65; G01N 21/78;
(Continued)

(56) References Cited

U.S. PATENT DOCUMENTS

| 2018/0203080 | A1* | 7/2018 | Acosta | C30B 33/12 |
| 2022/0082639 | A1* | 3/2022 | Kim | G01R 33/26 |
| 2023/0393221 | A1* | 12/2023 | Slocum | G01R 33/032 |

FOREIGN PATENT DOCUMENTS

| CN | 110325869 A | * | 10/2019 | G01N 24/10 |
| CN | 114467024 A | * | 5/2022 | G01N 24/10 |

(Continued)

OTHER PUBLICATIONS

Arai, K. et al., "Fourier magnetic imaging with nanoscale resolution and compressed sensing speed-up using electronic spins in diamond," Nature Nanotechnology (2015) 10:859-864.

(Continued)

*Primary Examiner* — Michael P Stafira
(74) *Attorney, Agent, or Firm* — Mark A. Dodd

(57) ABSTRACT

The present invention is directed to devices and systems for rapidly producing high resolution images of magnetic fields in a sample. The devices and systems employ diamond chips with color centers that fluoresce in the presence of magnetic fields. The high resolution is due to the use of one of three excitation methods. The first method employs modulation of an acoustic surface wave, which increases/decreases the sensitivity of the color centers to magnetic fields. The second and third methods employ arrays of magnetic field coils and electrode pairs, respectively, which again increase/decrease the sensitivity of the color centers to magnetic fields. The color centers are preferably nitrogen vacancies in the diamond chips.

13 Claims, 3 Drawing Sheets

(52) U.S. Cl.
CPC ............... *G01N 2021/1721* (2013.01); *G01N 2021/1727* (2013.01); *G01N 2021/1729* (2013.01); *G01N 2021/6471* (2013.01)

(58) Field of Classification Search
CPC ....... G01N 2201/0612; G01N 2570/00; G01N 33/487; G01N 33/5308; G01N 33/543; G01N 33/54306; G01N 33/54333; G01N 33/54373; G01N 33/54386; G01N 33/68; G01N 33/6803; G01N 33/6842; G01N 2021/6463; G01N 21/6456; G01N 33/389; G01N 33/587; G01N 2021/6419; G01N 2021/6432; G01N 2021/8477; G01N 21/171; G01N 21/636; G01N 21/6404; G01N 21/643; G01N 21/6486; G01N 21/88; G01N 2201/067; G01N 2201/0691; G01N 2201/0697; G01N 2446/00; G01N 27/82; G01N 33/48728; G01N 33/542; G01N 33/54326; G01N 33/552; G01N 33/585
See application file for complete search history.

(56) References Cited

FOREIGN PATENT DOCUMENTS

| | | | | | |
|---|---|---|---|---|---|
| JP | 2014517322 A | * | 7/2016 | | |
| WO | WO-2013066446 A1 | * | 5/2013 | ............. | G01N 21/64 |
| WO | WO-2014051886 A1 | * | 4/2014 | ........... | G01N 21/645 |

OTHER PUBLICATIONS

Arroyo-Camejo, S. et al., "Stimulated Emission Depletion Microscopy Resolves Individual Nitrogen Vacancy Centers in Diamond Nanocrystals," ACS Nano (2013) 7(12):10912-10919.

Balasubramanian, G. et al., "Nanoscale imaging magnetometry with diamond spins under ambient conditions," Nature (2008) 455:648-651.

Block, M. et al., "Optically Enhanced Electric Field Sensing Using Nitrogen-Vacancy Ensembles," Physical Review Applied (2021) 16:024024, 21 pages.

Chen, E. H. et al., "Wide-Field Multispectral Super-Resolution Imaging Using Spin-Dependent Fluorescence in Nanodiamonds," Nano Letters (2013) 13:2073-2077.

Jaskula, J.-C. et al., "Superresolution optical magnetic imaging and spectroscopy using individual electronic spins in diamond," Optics Express (2017) 25(10):11048-11064.

Kehayias, P. et al., "Imaging crystal stress in diamond using ensembles of nitrogen-vacancy centers," Physical Review B (2019) 100:174103, 8 pages.

Kehayias, P. et al., "A physically unclonable function using NV diamond magnetometry and micromagnet arrays," Jounal of Applied Physics (2020) 127:203904, 8 pages.

Maurer, P. C. et al., "Far-field optical imaging and manipulation of individual spins with nanoscale resolution," Nature Physics (2010) 6:912-918.

Pfender, M. et al., "Single-spin stochastic optical reconstruction microscopy," PNAS (2014) 111(41):14669-14674.

Wildanger, D. et al., "Diffraction Unlimited All-Optical Recording of Electron Spin Resonances," Physical Review Letters (2011) 107:017601, 4 pages.

* cited by examiner

SUPER RESOLUTION AND FAST SURFACE B-FIELD IMAGING USING AN NV-DIAMOND

STATEMENT OF GOVERNMENT SUPPORT

This invention was made with Government support under Contract No. DE-NA0003525 awarded by the United States Department of Energy/National Nuclear Security Administration. The U.S. Government has certain rights in the invention.

BACKGROUND OF THE INVENTION

Field of the Invention

The present invention relates to improved magnetic-field imaging resolution using NV-diamond chips.

Brief Description of the Related Art

Thin diamond chips with color centers, for example, F-centers due to single-atom crystal defects, such as nitrogen vacancy centers (NV-centers), have been used in demonstrations of sensing/imaging near-surface magnetic fields (B-fields). This enables new diagnostic capability in material science, solid-state physics, bioscience, microfabricated electronics, and, more recently, has demonstrated physically unclonable functions. A typical imaging method is to place an NV-diamond chip on a surface of interest and illuminate this NV-diamond chip with a strong light source (typically a laser >100 mW) at a wavelength shorter than 650 nm (typically 532 nm, because of the convenience of an Nd-YAG laser). Microwaves, at a frequency of approximately 2.87 GHz, are applied to the NV-diamond chip to excite the B-field sensitive resonances, which change the fluorescence strength depending on the B-field strength. By imaging the B-field sensitive fluorescence at wavelengths longer than 650 nm, one can map the B-field pattern on the surface of the item being examined. This imaging method is relatively fast and is convenient to set up, but its imaging resolution is limited by optical diffraction limit, which is defined as $\approx \lambda/2NA$, where $\lambda$ is the wavelength, and NA is the numerical aperture of the imaging lens. Thus, with typical wavelengths of $\lambda \geq 650$ nm and numerical apertures of NA~0.25, imaging resolution is limited to $\geq 1$ μm.

In order to obtain imaging resolution better than the diffraction limit, several methods have been proposed and demonstrated. They include the following: directly applying various existing optical super-resolution schemes, mechanically scanning a nano-NV-diamond probe, using a magnetic-resonance-imaging (MRI) approach by applying additional B-field gradients to select specific NV-centers/emitters for better resolution imaging, using a tightly focused excitation laser (green) with a Laguerre-Gaussian mode stimulated laser beam (near-IR) to scan across the NV-diamond chip to select a specific NV-center/emitter to generate spatially localized signals, and using temporally-resolved NV-emitter-specific random signals to isolate different NV-centers, taking advantage of the temporal and spatial responses of NV-centers to the excitation laser, microwave field, and RF field to distinguish different signals from different NV-centers.

The primary drawbacks of these various demonstrated techniques to achieve imaging resolution better than the diffraction limit is the slow imaging time resulting from the slow scanning across the surface of interest or due to the complicated laser schemes, control sequences in time, and the signal processing overheads.

Thus, for an NV-diamond chip with dense NV-centers/emitters, the need exists for a way to achieve fast B-field imaging with super resolution via efficiently switching ON/OFF the NV-centers at the desired times and locations on the chip. Imaging resolution can also be improved by improving the photon collection efficiency of the B-field sensitive fluorescence signals.

SUMMARY OF THE INVENTION

One aspect of the present invention relates to taking advantage of the microwave resonances of the NV-centers in diamond that respond not only to magnetic fields but also other physical quantities, such as temperature, pressure/stress, shearing force, electric field (E-field), etc. These features can be exploited to achieve fast surface magnetic-field imaging with resolution beyond optical diffraction limit using advanced microfabrication techniques. Specific approaches include: (1) utilizing the modulation of the stress and/or shearing on the diamond chip, (2) manipulating the 2D B-field configuration, and (3) manipulating the 2D E-field configuration to obtain spatial magnetic field information having better than 1 μm resolution. The demonstrated maximum NV-center density is on the order of $10^{16}$ cm$^{-3}$. Therefore, on average, there is approximately one NV-center/emitter per $50^3$ cubic nm. Hence, regardless of the approach, the maximum uniform resolution limited by a 50-nm thick NV-diamond chip is about approximately 50 nm.

In at least one embodiment of the invention, a magnetic field imaging system comprises a pump laser (the pump laser emitting a pumping light beam having a pumping light beam wavelength), a diamond chip, the diamond chip including a plurality of color centers (the plurality of color centers fluorescing in response to the pumping light beam and a magnetic field thereby creating fluorescence light), and means for modulating a sensitivity of the plurality of color centers to the magnetic field (the sensitivity being modulated in two orthogonal directions), a photodetector (the photodetector receiving the fluorescence light and producing data corresponding to the fluorescence light), and a signal processor (the signal processor receiving the data and converting the data into a corresponding magnetic-field image).

In various embodiments, the pumping light beam wavelength is shorter than approximately 600 nm; the diamond chip is formed on a substrate; the substrate includes one of silicon, quartz, a metal, or a carbide; the plurality of color centers includes a plurality of nitrogen vacancy centers; the fluorescence light has a wavelength longer than approximately 650 nm; the means for modulating includes two or more acoustic modulators (each acoustic modulator generating a corresponding acoustic standing wave in the diamond chip); each of the two or more acoustic modulators is a piezo transducer or a surface-acoustic-wave modulator; and the acoustic standing waves are either longitudinal or transverse waves.

In other embodiments, the means for modulating includes a two-dimensional array of coils (each coil generating a corresponding submicron or nano-scale control magnetic field in the diamond chip); the means for modulating includes a two-dimensional array of electrode pairs (each electrode pair generating a corresponding pixelized control electric field in the diamond chip); a ratio of a width of the photodetector to a distance between the diamond chip and the photodetector being between approximately 15 and approximately 25; the magnetic field imaging system further comprises a microwave source (the microwave source generating signals for driving the means for modulating); and the magnetic field imaging system further comprises a long-pass filter located between the diamond chip and the photodetector (the long-pass filter passing the fluorescence light and blocking scattered pumping light beam).

In at least one embodiment of the invention, a magnetic field imaging device comprises a diamond chip, a plurality of color centers located within the diamond chip (the plurality of color centers fluorescing in response to a pumping light beam and a magnetic field thereby creating fluorescence light), and means for modulating a sensitivity of the plurality of color centers to the magnetic field (the sensitivity being modulated in two orthogonal directions).

In various embodiments, the diamond chip is formed on a substrate; the plurality of color centers includes a plurality of nitrogen vacancy centers; the means for modulating includes two or more acoustic modulators (each acoustic modulator generating a corresponding acoustic standing wave in the diamond chip, each corresponding acoustic standing wave being one of a longitudinal wave or a transverse wave); the means for modulating includes a two-dimensional array of coils (each coil generating a corresponding submicron or nano-scale control magnetic field in the diamond chip); and the means for modulating includes a two-dimensional array of electrode pairs (each electrode pair generating a corresponding pixelized control electric field in the diamond chip).

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

DETAILED DESCRIPTION OF THE INVENTION

The terms "a" and "an" do not denote a limitation of quantity, but rather denote the presence of at least one of the referenced items. The term "or" means "and/or." The terms "comprising," "having," "including," and "containing" are to be construed as open-ended terms (i.e., meaning "including, but not limited to").

Acoustic Standing Wave Modulation

Figure 1A:
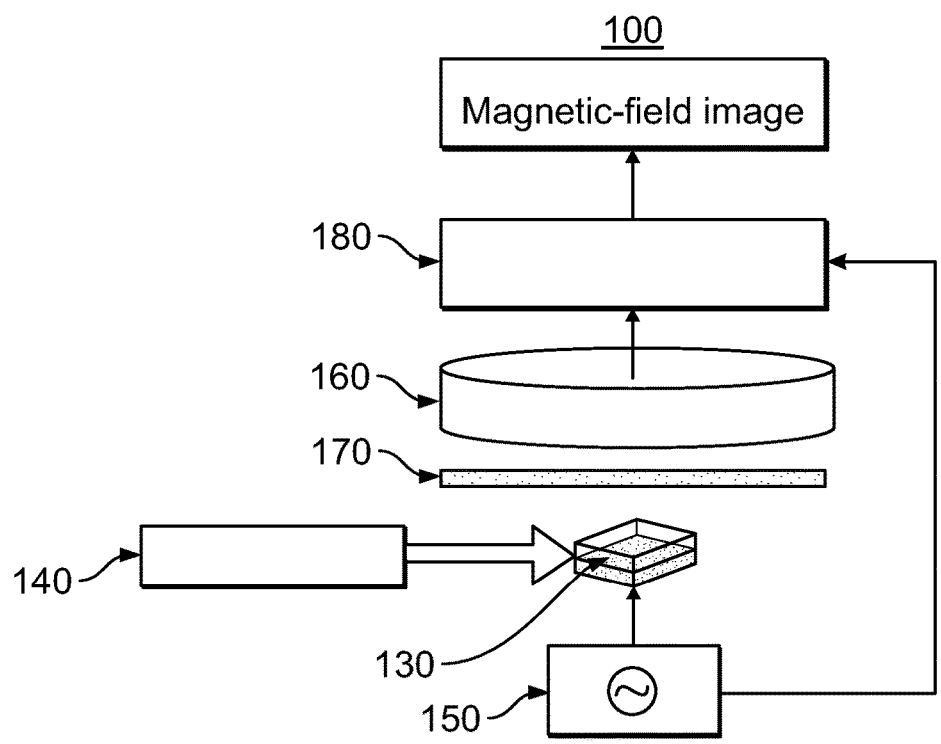
FIGS. 1A and 1B illustrate a magnetic field imager in accordance with a first class of embodiments of the present invention.
Figure 1B:
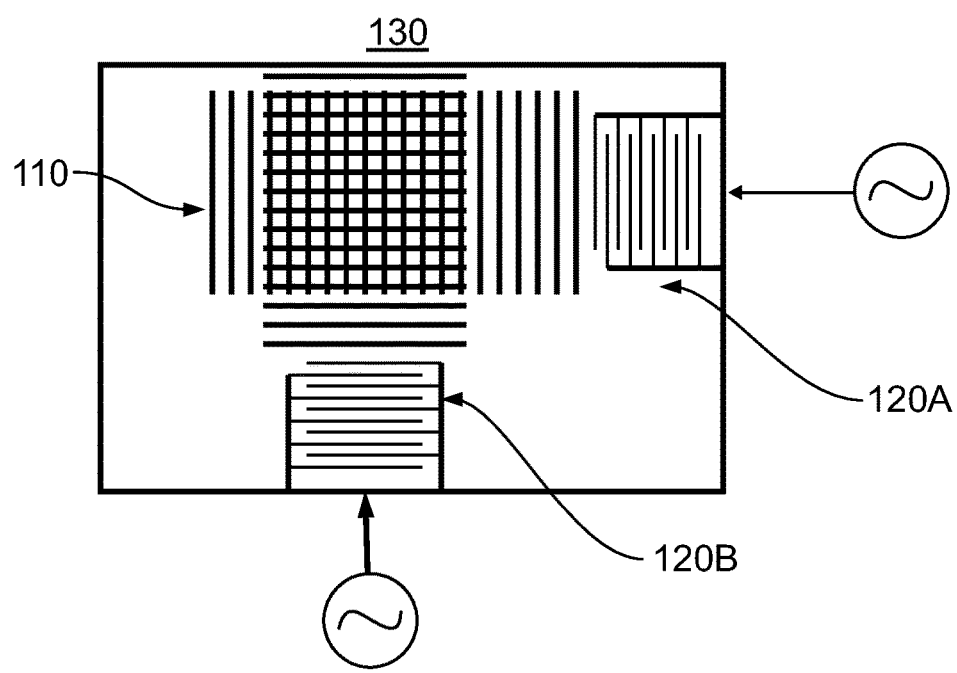

A first class of embodiments of a magnetic field imaging system 100 that employs modulation of acoustic standing waves in an NV-diamond chip 130, is illustrated in FIGS. 1A and 1B. Specifically, by applying acoustic standing waves 110, either longitudinal wave or transverse wave (stress or shearing modulation), along two orthogonal directions using acoustic modulators 120A, 120B in an NV-diamond chip 130, one can generate periodic patterns of stress or shearing. This leads to linewidth broadening of the B-field sensitive microwave resonances of NV-centers at antinodes (maximum change in stress or shearing) of the acoustic standing wave 110. The coefficient between the fluorescence strength and the magnetic-field amplitude, i.e., the sensitivity of the NV-centers to the magnetic field, is therefore periodically modulated across the NV-diamond chip 130, and the collected signal is then proportional to:

$$\int\int B(x, y)\sin\left(\frac{n_1\pi}{l_x}x\right)\sin\left(\frac{n_2\pi}{l_y}y\right)dxdy, \qquad (\text{Eq. 1})$$

Figure 2:
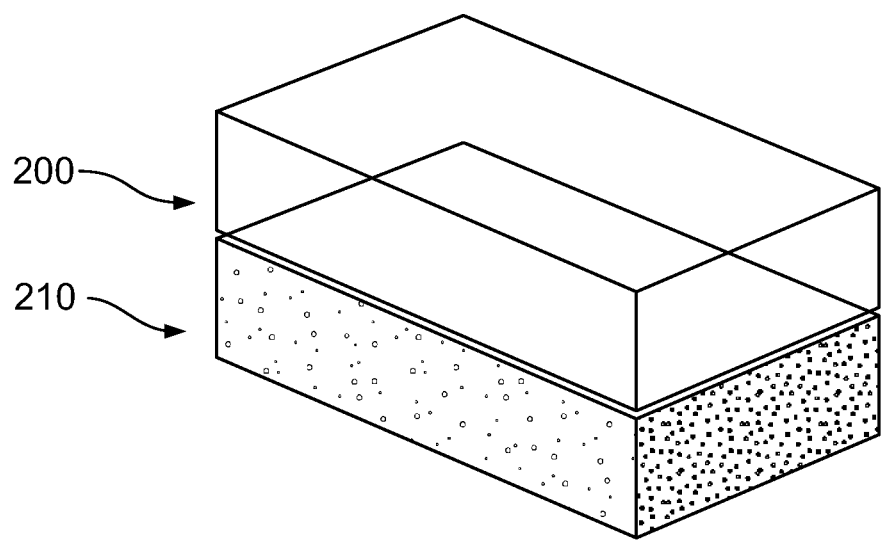
FIG. 2 illustrates a diamond thin-film that may be employed as part of a magnetic field imager in accordance with one or more embodiments of the present invention.

$l_x l_y n_1 n_2$ where and are the side lengths of the diamond chip 130. The total signal amplitude is measured with different and (integers representing the number of acoustic standing wave antinodes, with $n_1$ and $n_2$ being proportional to the acoustic frequencies along the x and y (orthogonal) directions, respectively). By taking the inverse Fourier transform (FT), one can recover B(x,y). The spatial resolution is limited by the maximum $n_1$ and $n_2$ that can be attained (i.e., $l_x/n_1$ and $l_y/n_2$). In this approach, a shorter acoustic wavelength on the NV-diamond chip 130 enables better spatial resolution. Unfortunately, the speed of sound in diamond is quite high, approximately 18,000 m/s. However, a diamond thin-film 200 having, for example, a thickness in the range of tens of nm to $l_x l_y n_1 n_2$ 1 µm, can, in principle, be grown via chemical vapor deposition (CVD) on a substrate 210, for example, silicon, quartz, metals, and carbides, resulting in the structure illustrated in FIG. 2. If the speed of sound is dominated by the material forming the substrate 210, one may slow it down to approximately 5,000 m/s. With this condition, to achieve a resolution of approximately 50 nm, one would like the shortest acoustic wavelength to be approximately 100 nm, which corresponds to an acoustic modulation frequency of approximately 50 GHz. To date, the demonstrated acoustic modulation on solids using microfabricated acoustic modulators 120A and 120B, for example, piezo transducers (such as interdigitated transducers (IDTs) as illustrated in FIG. 1B) or surface-acoustic-wave (SAW) modulators, can reach up to 10 GHz. At this frequency, one may be able to achieve approximately 250 nm resolution. Based on the resonance data in P. Kehayias (2019), the typical linewidth is on the order of 1 MHz and the stress induced frequency shift is about 4.86 MHz/GPa. See, P. Kehayias et al., "Imaging crystal stress in diamond using ensembles of nitrogen-vacancy centers," Physical Review B, vol. 100, art. no. 174103 (2019). If so, one would like the amplitude of the oscillating stress to be at least >1 GPa to attain effective modulation on the NV-centers/emitters.

Returning to FIG. 1, the magnetic field imaging system 100 comprises an NV-diamond chip 130 with or without a substrate 210. A pump laser 140 emits a pumping light beam having a pumping light beam wavelength shorter than approximately 600 nm. The pumping light beam produces a population difference between the magnetic-sensitive quantum states in the NV centers and induces fluorescence within the NV-diamond chip 130. A microwave source 150 driving the acoustic modulators 120A, 120B is used to excite magnetic sensitive resonances that can modify the strength of the fluorescence. No lens is needed in the magnetic field imaging system 100. A large-area photodetector 160 is placed very close to the NV-diamond chip 130 to achieve a large NA (~0.9), which greatly improves the detection signal-to-noise ratio (SNR), to detect the fluorescence light at wavelengths longer than approximately 650 nm. A ratio of a width of the large-area photodetector 160 to a distance between the NV-diamond chip 130 and the large-area photodetector 160 may, for example, be between approximately 15 and 25. A long-pass filter 170 is needed to block the scattered pump light from the NV-diamond chip 130. Computer-based control can be used to send a series of predetermined imaging patterns via acoustic, magnetic, or electric approaches, as described below, to the NV-diamond chip 130. After acquiring signals from all different imaging patterns, a signal processor 180 constructs a magnetic-field image in the NV-diamond chip area with super resolution.

Because of the sinusoidal-based modulation (encoding) and demodulation (decoding) scheme, one can eliminate an imaging detector with multiple pixels and use just the single, large-area photodetector 160, which can be brought very close to the NV-diamond chip 130 without a lensing system to obtain a much larger NA, for example, up to 0.9, instead of 0.25 in the prior art imaging system. The photon collection efficiency can then be improved by a factor of 10 to 20. The practical issues are whether one can tune the acoustic modulators 120 for $n_1$ and $n_2$ from 1 to the maximum value with flat enough response, and whether one can quickly switch the standing wave 110 from one mode to another. If these are not of concern, one may be able to obtain super resolution with a faster data acquisition time due to the better photon collection efficiency and therefore a higher SNR. Fundamentally, the SNR is determined by the number of collected photons from every spot on the NV-diamond chip 130 to the large-area photodetector 160 (shot-noise limit). As long as one acquires the same number of photons from a spot on the NV-diamond chip 130 to the large-area photodetector 160 within a given time, it does not matter whether one uses sinusoidal-based encoding or pixel-based encoding. If the photon collection efficiency is improved by 10X, one can obtain the same SNR in a 10X shorter time.

If it turns out the acoustic modulation cannot be as broadband as desired and/or the switching between standing wave modes cannot be as fast as desired, one can employ the prior art imaging approach to obtain spatial information with discrimination on the order of 1 μm by using the standing-wave modulation with wavelengths only ≤1 μm. Thus, the bandwidth that is required for the acoustic modulation can be much narrower, and the number of $n_1$ and $n_2$ values can be much smaller.

Submicron Magnetically Controlled NV-Centers/Emitters on an NV-Diamond Chip

Figure 3:
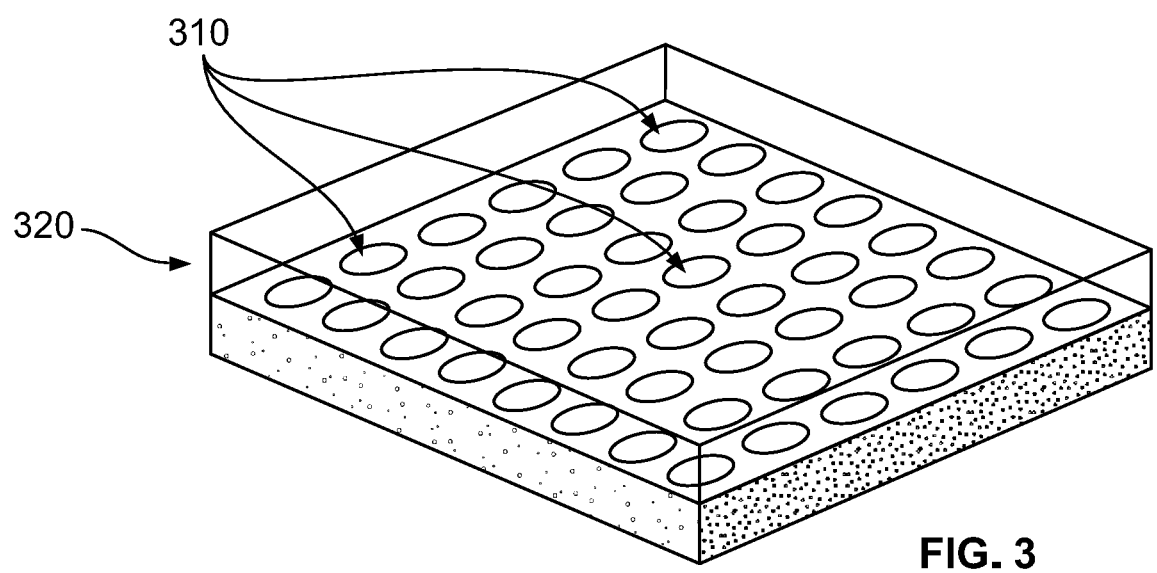
FIG. 3 illustrates a diamond thin-film that may be employed as part of a magnetic field imager in accordance with one or more embodiments of the present invention.

A second class of embodiments employs B-fields to control the NV-centers/emitters. The B-field frequency shift on the NV microwave resonance is 2.8 MHz/G. Hence, to switch on/off the NV centers/emitters, i.e., modulate their sensitivity, one would like the control B-field to be at least 1 gauss (G), assuming the resonance linewidth is about 1 MHz. As illustrated in FIG. 3, one can fabricate a B-field control array 300 comprising a 2D array of submicron or nano-scale B-field coils 310 (current loops) on the lower surface of a NV-diamond chip 320, and each coil 310 can be individually addressed. For a 100-nm size coil 310, to generate ~1 G field, one would need a few tens of μA of driving current for the coil 310, which should be quite feasible. Using the B-field control array 300, one can encode and decode any detection patterns for super resolution with a fast control speed. Similar to the acoustic approach illustrated in FIG. 1, one can either use a single, large-area detector for a very large NA or use a conventional imaging scheme, but doing the same encoding inside every diffraction limited area (~1 μm$^2$) if the number of control channels is not feasible. For example, for a 1 mm$^2$ area, one needs 100 million control channels for 100 nm resolution. The other practical limitation is the thickness of the NV-diamond chip 320, which has to be less than or equal to the size of the coil 310 owing to near-field restriction of a multipole field source.

Submicron Electrically Controlled NV-Centers/Emitters on an NV-Diamond Chip

Figure 4:
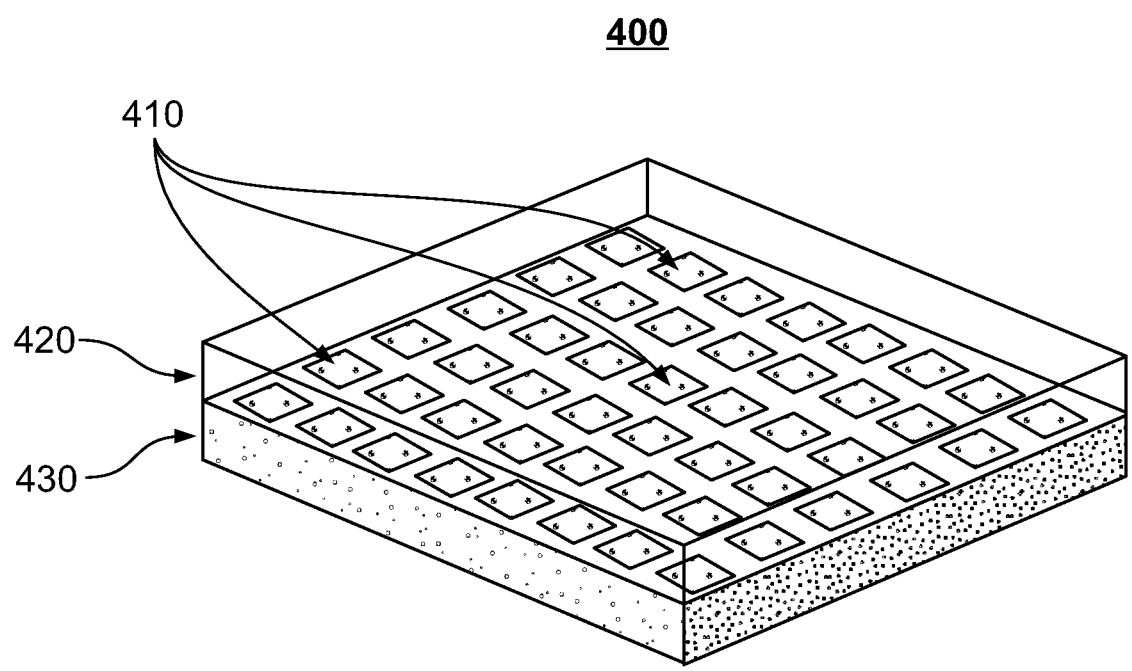
FIG. 4 illustrates a diamond thin-film that may be employed as part of a magnetic field imager in accordance with one or more embodiments of the present invention.

A third class of embodiments employs E-fields to modulate the sensitivity of the NV-centers/emitters. Similar to magnetically controlled NV-centers/emitters, and as illustrated in FIG. 4, one can fabricate an E-field control array 400 comprising an array of electrode pairs 410 on the surface of an NV-diamond chip 420 to produce pixelized control electric fields on the scale of a few tens of nm or larger. According to Block (2021), the ground-state E-field splitting coefficients are 17 and 0.35 Hz per V/cm for perpendicular and parallel modes. See, M. Block et al., "Optically Enhanced Electric Field Sensing Using Nitrogen-Vacancy Ensembles," Physical Review Applied, vol. 16, art. no. 024024 (2021). For electrodes 410 having a spacing of approximately 100 nm, to generate a few MHz frequency shift on the microwave resonance, one would need to apply up to a few tens of volts to the electrodes 410, which is quite feasible. The dielectric strength in such small dimension for many solid-state materials is usually >10$^8$ V/m, so this is not a concern either. Other practical considerations, such as the thickness of the NV-diamond chip 420, use of single-area or pixel detector, etc., are the same as the magnetically control approach of the second class of embodiments. Note that while the array of electrode pairs 410 is illustrated at the interface between the NV-diamond chip 420 and the substrate 430, transparent electrodes could alternatively be employed on the opposite (top) surface of the NV-diamond chip 420. Such transparent electrodes could be formed, for example, of indium tin oxide (ITO), which would allow the fluorescence to escape the NV-diamond chip 420.

In summary, each of the three classes of embodiments is based on the same principle, i.e., to control or switch on/off the NV-centers/emitters in a scale smaller than the diffraction limit on a 2D plane. Therefore, one can encode and decode the detection pattern for higher resolution. There may be other mechanisms to achieve the same controlling capability. In practice, one approach may be more advantageous than others depending on different considerations. For example, the NV-center magnetometry usually requires microwaves. The presence of the coil or electrode array may influence the local microwave field. Thus, the acoustic approach may be better. On the other hand, if this is not a concern, a magnetic- or electric-field control array offers better spatial resolution since current microfabrication technology can generate features with dimensions of a few tens of nm more easily than producing 100 GHz acoustic wave on diamond. In addition, controlling an electrostatic field from electrodes may also be easier than controlling static currents on coils.

All publications, including but not limited to patents and patent applications, cited in this specification are herein incorporated by reference as though set forth in their entirety in the present application.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A magnetic field imaging system, comprising:
   a pump laser adapted to emit a pumping light beam having a pumping light beam wavelength;
   a diamond chip, the diamond chip including:
      a plurality of color centers, the plurality of color centers adapted to fluoresce in response to the pumping light beam and a magnetic field thereby creating fluorescence light; and
      means for modulating a sensitivity of the plurality of color centers to the magnetic field, the sensitivity being modulated in two orthogonal directions, the means for modulating including two or more acoustic modulators, each acoustic modulator adapted to generate a corresponding acoustic standing wave in the diamond chip;
   a photodetector adapted to receive the fluorescence light and to produce data corresponding to the fluorescence light; and
   a signal processor adapted to receive the data and to convert the data into a corresponding magnetic-field image.

2. The magnetic field imaging system of claim 1, wherein the pumping light beam wavelength is shorter than approximately 600 nm.

3. The magnetic field imaging system of claim 1, wherein the diamond chip is formed on a substrate.

4. The magnetic field imaging system of claim 3, wherein the substrate includes one of silicon, quartz, a metal, or a carbide.

5. The magnetic field imaging system of claim 1, wherein the plurality of color centers includes a plurality of nitrogen vacancy centers.

6. The magnetic field imaging system of claim 1, wherein the fluorescence light has a wavelength longer than approximately 650 nm.

7. The magnetic field imaging system of claim 1, wherein each of the two or more acoustic modulators is a piezo transducer or a surface-acoustic-wave modulator.

8. The magnetic field imaging system of claim 1, wherein the acoustic standing waves are one of longitudinal waves or transverse waves.

9. The magnetic field imaging system of claim 1, wherein the means for modulating further includes a two-dimensional array of coils, each coil adapted to generate a corresponding submicron or nano-scale control magnetic field in the diamond chip.

10. The magnetic field imaging system of claim 1, wherein the means for modulating further includes a two-dimensional array of electrode pairs, each electrode pair adapted to generate a corresponding pixelized control electric field in the diamond chip.

11. The magnetic field imaging system of claim 1, wherein a ratio of a width of the photodetector to a distance between the diamond chip and the photodetector is between approximately 15 and approximately 25.

12. The magnetic field imaging system of claim 1, further comprising a microwave source adapted to generate signals for driving the means for modulating.

13. The magnetic field imaging system of claim 1, further comprising a long-pass filter located between the diamond chip and the photodetector, the long-pass filter adapted to pass the fluorescence light and block scattered pumping light beam.

* * * * *